United States Patent [19]

Sunaga et al.

[11] Patent Number: 4,580,523
[45] Date of Patent: Apr. 8, 1986

[54] JIG APPARATUS FOR ARRAYING AND SUPPORTING WORKS TO BE SOLDERED

[75] Inventors: Takeshi Sunaga, Tokyo; Kiyoshi Suzuki, Tokorozawa; Takayuki Yuzawa, Hoya, all of Japan

[73] Assignee: Kabushiki Kaisha Tamura Seisakusho, Tokyo, Japan

[21] Appl. No.: 703,620

[22] Filed: Feb. 21, 1985

[30] Foreign Application Priority Data

Jul. 31, 1984 [JP] Japan ................. 59-118569

[51] Int. Cl.⁴ ............................................ B05C 13/00
[52] U.S. Cl. ................... 118/503; 118/423; 269/903; 134/61; 198/339.1; 198/803.4
[58] Field of Search ............. 118/503, 427, 423, 428, 118/74, 500, 70; 134/142, 61; 198/342, 652, 653; 269/903; 29/760, 741, 759; 221/298; 228/37

[56] References Cited

U.S. PATENT DOCUMENTS

| | | | |
|---|---|---|---|
| 3,056,371 | 10/1962 | Frank | 118/423 X |
| 3,713,876 | 1/1973 | Lavric | 118/423 X |
| 4,015,704 | 4/1977 | Warren | 192/652 |
| 4,295,441 | 10/1981 | Forstner et al. | 118/425 |
| 4,526,185 | 7/1985 | Fukuda | 134/142 X |

FOREIGN PATENT DOCUMENTS 54-146968  11/1979  Japan ................. 118/500
58-57269   12/1983  Japan .

*Primary Examiner*—Bernard F. Plantz
*Attorney, Agent, or Firm*—James E. Nilles

[57] ABSTRACT

A jig apparatus for arraying and supporting work to be soldered wherein a plurality of lower supporting bars for supporting the lower side of a work are arranged so as to extend in a frame designed to be mounted on a conveyor holder of an automatic soldering line, upper supporting bars are arranged so as to extend above and in parallel with the lower supporting bars to press the work from the upper side thereof. The upper supporting bars have one end fitted to the frame. A gate member supports the other end of the upper supporting bars and movable up and down with respect to the frame. Work insertion openings are formed in the frame such as to oppose the gate member. The lower supporting bars are made of elongated channel members with a substantially U-shaped cross-section, each of the elongated channel members having holes formed in the floor thereof.

3 Claims, 7 Drawing Figures

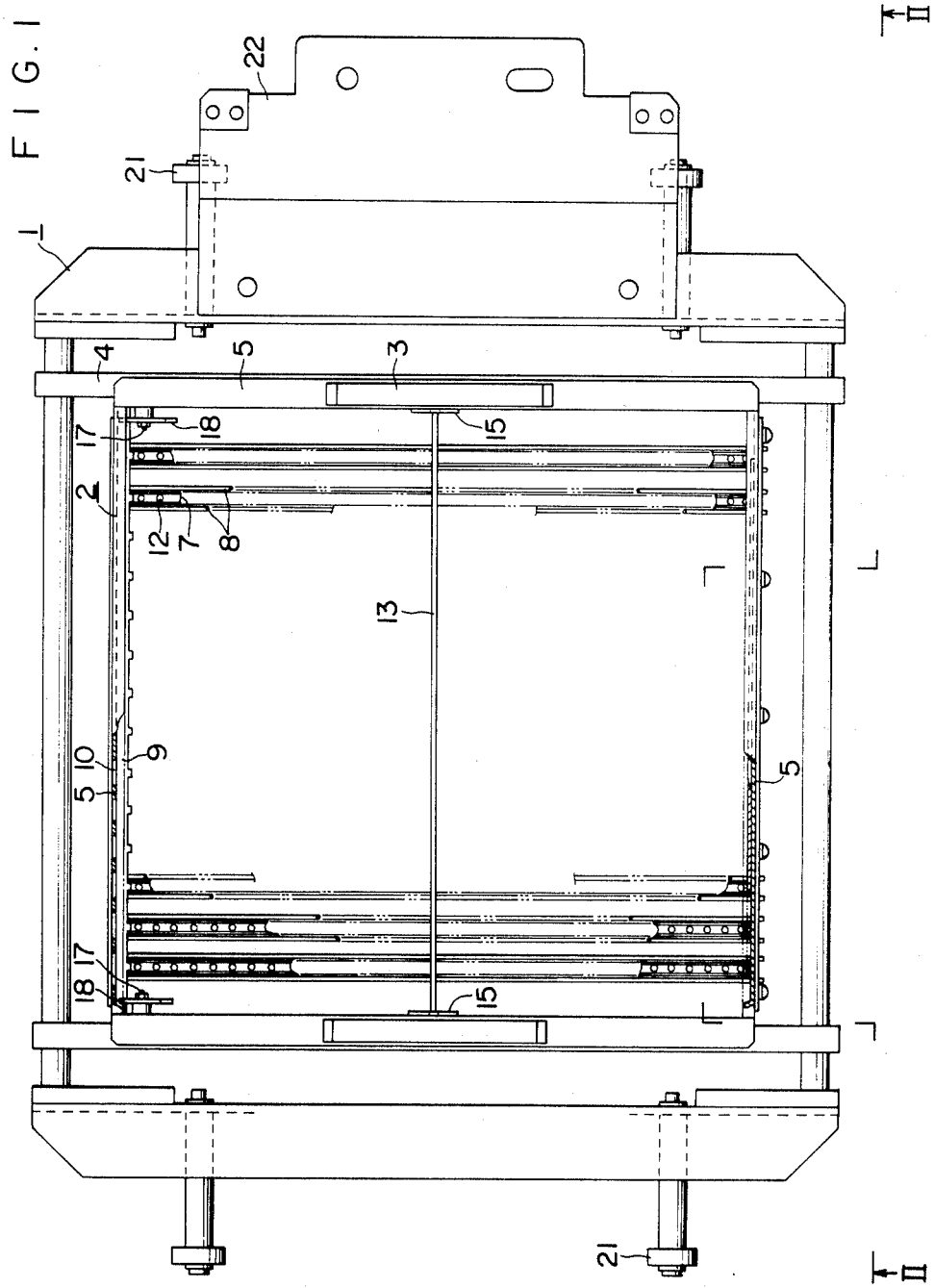

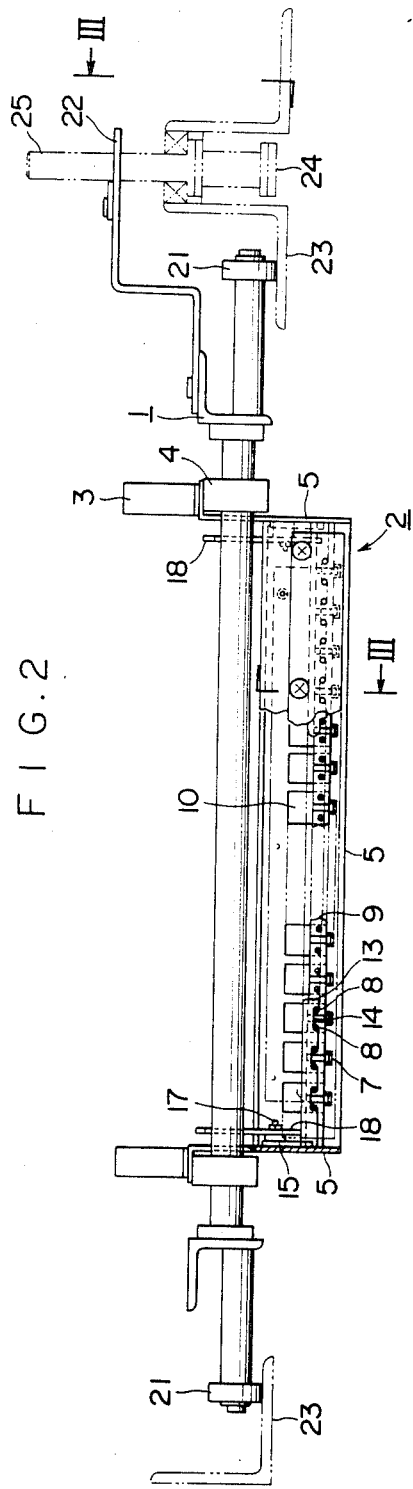

JIG APPARATUS FOR ARRAYING AND SUPPORTING WORKS TO BE SOLDERED

BACKGROUND OF THE INVENTION

1. Field of the Invention:

The present invention relates to a jig apparatus for use in application of a solder coat to the lead frames of works such as ICs to be soldered. More particularly, the invention is concerned with a jig apparatus adapted to be mounted on a conveyor line of an automatic soldering line, while arraying and supporting the work.

2. Description of the Prior Art:

As disclosed in Japanese Patent Publication No. 57269/1983, the conventional jig of the kind described is constituted by frames adapted to be retained by the conveyor holder of the soldering line, a plurality of pairs of lower steel wires stretched between adjacent frames and adapted to support the lower part of the work, a plurality of pairs of upper steel wires extended above said lower steel wires along both side surfaces of the body of the work, the upper steel wires being secured at their one end to said frames, gate members supporting the other end of said upper steel wires and movable up and down with respect to the frames, and work insertion openings formed in the frames such as to oppose the gate members. In use, the work such as ICs is inserted through the insertion openings onto two lower steel wires past the space under the gate members in the raised position, and the gate members are lowered so that the work is pressed and held by two upper steel wires.

In this known jig apparatus, the upper steel wires of each pair can be reinforced by an intermediate supporting bar which connects the intermediate regions of these steel wires, thus preventing any deformation of the steel wires. In the case of the lower steel wires, however, it is impossible to reinforce these steel wires by a member such as the intermediate bar connecting mid portions of the wires of each pair, because of a fear that a part such as the lead frame of the IC may interfere with the intermediate supporting bar during the sliding of the IC along the lower steel wires to the innermost position. It is, therefore, quite difficult to maintain the parallelism and linearity of two lower steel wires of all pairs. Lack of linearity of the lower steel wires tend to cause problems such as dropping the ICs.

SUMMARY OF THE INVENTION

An object of the invention is to provide a jig apparatus having lower supporting bars which have a special shape so as to maintain the linearity thereof.

To this end, according to the invention, there is provided a jig apparatus having lower supporting bars and upper supporting bars adapted for arraying and supporting a multiplicity of work units such as integrated circuits, the jig apparatus being adapted to be mounted on a conveyor holder of an automatic soldering line, wherein the improvement comprises that at least the lower supporting bars are made of elongated channel members with a substantially U-shaped cross-section, each of the elongated channel members having holes formed in the floor thereof.

The basic arrangement of the jig apparatus as a whole has, as in the case of a conventional jig apparatus, a frame designed to be mounted on a conveyor holder of the automatic soldering line, a plurality of lower supporting bars extended in the frame and adapted to support the lower side of the works, upper supporting bars extended above and in parallel with the lower supporting bars such as to press the works from the upper side thereof, the upper supporting bars having one end fitted to the frame, gate members supporting the other end of the upper supporting bars and movable up and down with respect to the frame, and work insertion openings formed in the frame such as to oppose the gate members.

According to the invention, after raising the gate member, work units to be soldered are successively brought into the space between the lower supporting bars and the upper supporting bars through the insertion opening. Then, the gate member is lowered so that the insertion opening is closed and the work is clamped between the upper and lower supporting bars. Since the lower supporting bars are channel members having a substantially U-shaped cross-section, they are rigid and resist deformation both in the lateral and the vertical directions so as to maintain good linearity. The lower supporting bars, therefore, can stably hold a number of work units along the length thereof. The work is, for example, integrated circuits having lead frames. The lead frames are dipped in the molten solder together with the lower supporting bars and soldering is conducted on the lead frames.

The invention will be fully described hereinunder with reference to the accompanying drawings.

BRIEF DESCRIPTION OF THE DRAWINGS

FIG. 1 is a plan view of an embodiment of the jig apparatus in accordance with the invention in the state mounted on a conveyor holder;

FIG. 2 is a sectional view taken along the line II—II of FIG. 1;

FIG. 3 is a sectional view taken along the line III—III of FIG. 2;

DESCRIPTION OF THE PREFERRED EMBODIMENT

Figure 4A:
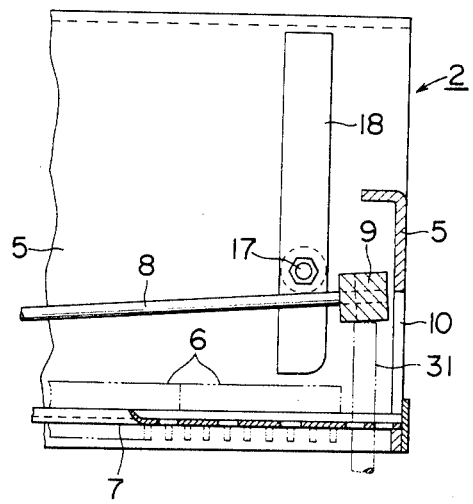
FIGS. 4a and 4b are enlarged sectional views of insertion openings.

As shown in FIGS. 1 to 3, a jig apparatus 2 for arraying and supporting work to be soldered is put into a conveyor holder 1 and fixed in the same from the upper side. The jig apparatus 2 has a frame 5 made of titanium and provided with a pair of handles 3. The frame 5 is adapted to be retained by supporting portions 4 on both sides of the conveyor holder 1. The jig apparatus further has a plurality of lower supporting bars 7 made of titanium and welded to the lower portion of the frame 5 at a predetermined pitch. The lower supporting bars 7 are adapted to support the lower side of works to be soldered which are in this case integrated circuits (referred to as "IC", hereinunder) 6, in a manner shown in FIG. 5. The jig apparatus further has pairs of upper bars 8 having a circular cross-section and made of titanium. The upper bars 8 constitute upper supporting bars. The upper supporting bars extend above and in parallel with the lower supporting bars 7 such as to retain the ICs from the upper side thereof and are loosely received at one end by the frame 5. The jig apparatus also has a gate member 9 fixed to the other ends of the upper supporting bars 8 and movable up and down with respect to the frame 5. An IC insertion opening 10 is formed in the frame 5 such as to oppose the gate member 9.

Figure 5:
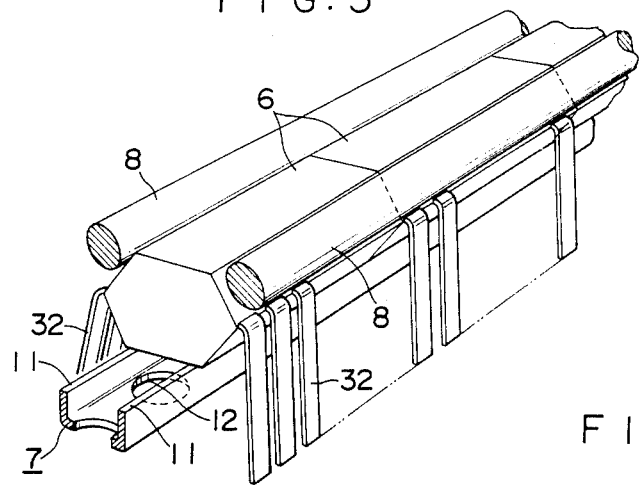
FIG. 5 is an enlarged perspective view showing the state in which an IC is supported.

As will be seen from FIG. 5, each of the lower supporting bars 7 is an elongated channel member having a substantially U-shaped cross-section with both vertical walls 11 adapted to support the lower face of the IC 6. The floor of the lower supporting bar 7 is provided with holes 12 formed therein at a predetermined pitch. These holes 12 serve as drain holes through which water in the bar 7 is discharged at the time of washing.

The upper bars 8 are held at their mid regions by being fitted in lower grooves 14 formed in intermediate supporting bars 13 so that two upper bars 8 of respective pairs are held linearly and in parallel with each other. The intermediate supporting bars 13 have both ends received by elongated grooves 16 in guide members 15 which are fastened to the inner surfaces of the frame 5 by screws, such as to be moved up and down along the elongated grooves 16.

As shown in FIG. 4a, lever-like stoppers 18 are rotatably secured to the portions of the frame 5 opposing both end surfaces of the gate member 9, by shafts 17, such that the lower ends of the stoppers 18 oppose both ends of the gate member 9.

Figure 4B:
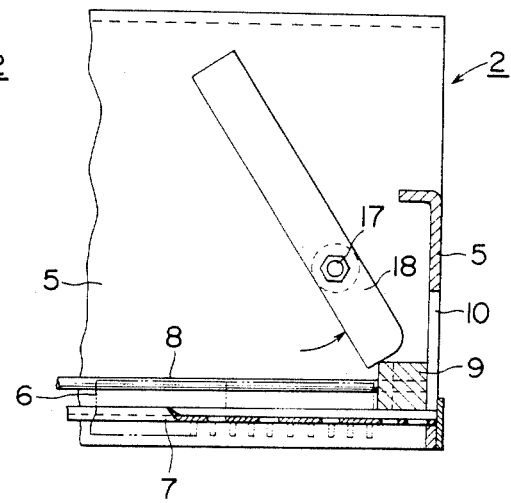

Then, as shown in FIG. 4b, the stoppers 18 are rotated with the ICs 6 sandwiched between the lower supporting bars 7 and the upper bars 8. In consequence, the gate member 9 is pressed by the lower ends of the stoppers 18 onto the insertion opening 10 and the lower supporting bars 7, thereby locking the gate member 9. For taking out the ICs 6, the stoppers 18 are rotated to the position shown in FIG. 4a thus unlocking the gate member 9.

As shown in FIGS. 1 and 2, the conveyor holder 1 is provided with four wheels 21 and an engaging plate 22 on one side thereof. The wheels 21 are adapted to roll on both rails 23 while the engaging plate 22 is engaged by a conveyor pin 25 on the conveyor chain 24, so that the holder 1 runs along the rails 23 by being toward by pins 25 on the chain 24.

An explanation will be made as to the manner in which the ICs are inserted into the jig apparatus.

When the empty jig apparatus 2 is set on a seesaw type IC shifting device (not shown), the gate members 9 are pushed by pushing pins 31 as shown in FIG. 4a thus opening respective insertion openings 10. In this state, it is possible to insert a multiplicity of ICs 6 into the space between the lower supporting bars 7 and the upper bars 8 through the insertion openings 10 from IC tubes or IC magazines (not shown) connected to the insertion openings. During the insertion, the ICs 6 are moved by the force of gravity as the jig apparatus 2 and the IC magazines are inclined as a unit with each other.

After the insertion of a multiplicity of ICs 6 in the jig apparatus, the jig apparatus is lifted away from the IC shifting device, so that the gate member 9 is disengaged from the pin 31 and lowered so that the upper bars 8 of respective pairs press upper portions of both side surfaces of the bodies of ICs 6. Then, the gate member 9 is locked by the stoppers 18 as shown in FIG. 4b, thus securely holding ICs 6.

Figure 6:
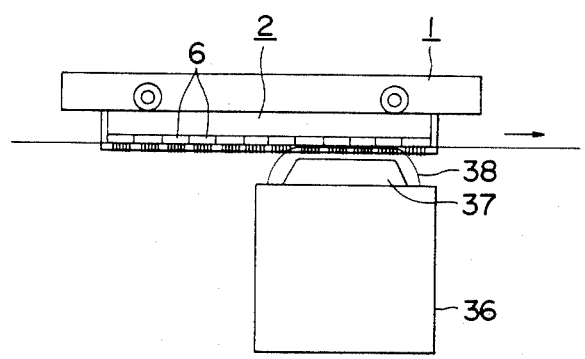
FIG. 6 is an illustration of the soldering work conducted with the assist by the jig apparatus of the invention.

The jig apparatus 2 thus loaded with the ICs 6 is mounted on the conveyor holder 1 of a soldering line, so that the ICs are conveyed along the soldering line by the conveyor holder 1. During the conveying, lead frames 32 of the ICs are applied with flux and preheated. Then, as shown in FIG. 6, the ICs 6 are made to pass through molten solder 38 jetted from nozzles 37 in a solder cell 36 of jet-flow type, so that the solder is applied such as to form solder coats on the lead frames 32. Then, residual flux is washed away by warm and cold water. The water used in the washing tends to stay in the channel-shaped lower supporting bars 7. The water, however, can be effectively discharged through the holes 12 formed in the bottom wall of the lower supporting bars 7.

ADVANTAGES OF THE INVENTION

According to the invention, the lower supporting bars for supporting the work to be soldered are made of elongated channel members having a substantially U-shaped cross-section, so that the distortion is prevented and high linearity of the lower supporting members is ensured over the entire length thereof, thus eliminating the problem of the work falling through the gap between the upper and lower supporting bars. Also, the undesirable retention of washing water in the channel-shaped lower supporting bars is avoided due to the provision of holes in the bottom wall of each lower supporting bar.

What is claimed is:

1. In a jig apparatus for arraying and supporting work to be soldered, comprising: a frame designed to be mounted on a conveyor holder of an automatic soldering line; a plurality of lower supporting bars extended in said frame and adapted to support the lower side of said work; upper supporting bars extended above and in parallel with said lower supporting bars such as to press said work from the upper side thereof, said upper supporting bars having one end fitted to said frame; a gate member supporting the other end of said upper supporting bars and movable up and down with respect to said frame; and work insertion openings formed in said frame such as to oppose said gate member; the improvement characterized in that the lower supporting bars are made of elongated channel members with a substantially U-shaped cross-section, each of said elongated channel members having holes formed in the floor thereof.

2. The jig apparatus according to claim 1, wherein the lower surface of said each work is supported by both vertical side walls of said lower supporting bar.

3. The jig apparatus according to claim 1, wherein said holes formed in the floor of said lower supporting bar are used for discharging washing water from the lower supporting bar.

* * * * *